(12) United States Patent
Takiar

(10) Patent No.: US 7,864,540 B2
(45) Date of Patent: *Jan. 4, 2011

(54) PERIPHERAL CARD WITH SLOPED EDGES

(75) Inventor: Hem Takiar, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/930,909

(22) Filed: Oct. 31, 2007

(65) Prior Publication Data

US 2008/0049392 A1 Feb. 28, 2008

Related U.S. Application Data

(63) Continuation of application No. 10/782,969, filed on Feb. 20, 2004, now Pat. No. 7,307,848, which is a continuation of application No. 10/621,882, filed on Jul. 17, 2003, now abandoned.

(51) Int. Cl.
*H05K 1/14* (2006.01)
(52) U.S. Cl. .................. 361/737; 361/736; 361/760
(58) Field of Classification Search .......... 361/685–730
See application file for complete search history.

(56) References Cited

U.S. PATENT DOCUMENTS

| | | | |
|---|---|---|---|
| 4,791,608 A * | 12/1988 | Fushimoto | 365/52 |
| 4,849,944 A * | 7/1989 | Matsushita | 714/718 |
| 5,296,692 A | 3/1994 | Shino | |
| 5,408,386 A | 4/1995 | Ringer et al. | |
| 5,490,891 A | 2/1996 | Farquhar et al. | |
| 5,502,289 A | 3/1996 | Takiar et al. | |
| 5,537,292 A | 7/1996 | Bowen | |
| 5,603,629 A | 2/1997 | DeFrasne | |
| 5,608,606 A | 3/1997 | Blaney | |
| 5,617,297 A | 4/1997 | Lo et al. | |
| 5,663,901 A | 9/1997 | Wallace et al. | |
| 5,736,727 A | 4/1998 | Nakata et al. | |
| 5,752,857 A | 5/1998 | Knights | |
| 5,867,218 A | 2/1999 | Matsuzaki et al. | |
| 5,933,328 A | 8/1999 | Wallace et al. | |
| 5,986,891 A | 11/1999 | Sugimoto | |

(Continued)

FOREIGN PATENT DOCUMENTS

EP 0377937 7/1990

(Continued)

OTHER PUBLICATIONS

Office Action dated Oct. 22, 2007, European Patent Application No. 04777413.8.

(Continued)

*Primary Examiner*—Tuan T Dinh
(74) *Attorney, Agent, or Firm*—Vierra Magen Marcus & DeNiro LLP

(57) ABSTRACT

A peripheral card includes a circuit board, various circuit elements on the circuit board, a set of user terminals, a set of test terminals, and an enclosure that covers a portion of the circuit board and the circuit elements. The enclosure does not cover the user terminals and test terminals. After the peripheral card is tested, the test terminals are covered with a conformal contact coating in order to prevent access to the test terminals.

11 Claims, 8 Drawing Sheets

U.S. PATENT DOCUMENTS

| | | | |
|---|---|---|---|
| 6,040,622 | A | 3/2000 | Wallace |
| 6,085,412 | A | 7/2000 | Iwasaki |
| 6,109,939 | A | 8/2000 | Kondo et al. |
| 6,151,248 | A | 11/2000 | Harari et al. |
| D439,579 | S | 3/2001 | Auclair |
| D442,598 | S | 5/2001 | Wallace |
| D444,473 | S | 7/2001 | Okamoto |
| D445,096 | S | 7/2001 | Wallace |
| D445,111 | S | 7/2001 | Okamoto |
| 6,266,724 | B1 | 7/2001 | Harari et al. |
| D446,525 | S | 8/2001 | Okamoto |
| 6,279,114 | B1 | 8/2001 | Toombs et al. |
| D447,481 | S | 9/2001 | Wallace |
| 6,323,064 | B1 | 11/2001 | Lee et al. |
| D452,243 | S | 12/2001 | Wallace |
| D452,244 | S | 12/2001 | Wallace |
| D452,245 | S | 12/2001 | Wallace |
| D452,246 | S | 12/2001 | Wallace |
| 6,333,517 | B1 | 12/2001 | Tamaki |
| D452,690 | S | 1/2002 | Wallace |
| D452,864 | S | 1/2002 | Wallace |
| D452,865 | S | 1/2002 | Wallace |
| D453,515 | S | 2/2002 | Brewer |
| D453,934 | S | 2/2002 | Wallace |
| 6,357,663 | B1 | 3/2002 | Takahashi et al. |
| 6,373,706 | B1 * | 4/2002 | Kasahara et al. ............ 361/725 |
| D457,887 | S | 5/2002 | Kadonaga |
| D459,355 | S | 6/2002 | Shomoda |
| 6,410,355 | B1 | 6/2002 | Wallace |
| D460,456 | S | 7/2002 | Shomoda |
| 6,445,060 | B1 | 9/2002 | Courtenay et al. |
| 6,456,528 | B1 | 9/2002 | Chen |
| 6,462,273 | B1 | 10/2002 | Corisis et al. |
| 6,478,679 | B1 | 11/2002 | Himoto et al. |
| D467,586 | S | 12/2002 | Shomoda |
| 6,537,842 | B2 | 3/2003 | Akram |
| 6,611,284 | B2 | 8/2003 | Lourie et al. |
| 6,616,053 | B2 | 9/2003 | Kondo |
| 6,618,258 | B2 | 9/2003 | Goris |
| 6,631,201 | B1 | 10/2003 | Dickinson et al. |
| 6,658,510 | B1 | 12/2003 | Bartucca |
| 6,658,516 | B2 | 12/2003 | Yao |
| 6,663,398 | B2 | 12/2003 | Shimada |
| 6,669,494 | B2 | 12/2003 | Abe |
| D487,747 | S | 3/2004 | Yu |
| D488,476 | S | 4/2004 | Yu |
| D488,477 | S | 4/2004 | Yu |
| 6,726,508 | B2 | 4/2004 | Watanabe et al. |
| 6,729,548 | B2 | 5/2004 | Kondo |
| 6,733,954 | B2 | 5/2004 | Yamamoto et al. |
| 6,736,678 | B2 | 5/2004 | Yao |
| 6,738,259 | B2 | 5/2004 | Le |
| D492,688 | S | 7/2004 | Wallace |
| 6,832,920 | B2 | 12/2004 | Glad |
| 6,843,421 | B2 | 1/2005 | Chhor et al. |
| 6,920,517 | B2 | 7/2005 | Mills |
| 7,065,656 | B2 | 6/2006 | Schwenck et al. |
| 7,094,633 | B2 | 8/2006 | Takiar |
| 2001/0015382 | A1 | 8/2001 | Tiffany |
| 2002/0042125 | A1 | 4/2002 | Petersen |
| 2003/0181074 | A1 | 9/2003 | Liu |
| 2004/0041024 | A1 | 3/2004 | Liu |
| 2004/0043664 | A1 | 3/2004 | Sato |
| 2004/0064619 | A1 | 4/2004 | Liu |
| 2004/0089717 | A1 | 5/2004 | Harari et al. |
| 2005/0011671 | A1 | 1/2005 | Takiar |
| 2005/0013106 | A1 | 1/2005 | Takiar |
| 2005/0014298 | A1 | 1/2005 | Takiar |
| 2005/0021909 | A1 | 1/2005 | Much |
| 2005/0105360 | A1 | 5/2005 | Takiar |
| 2005/0111280 | A1 | 5/2005 | Takiar |
| 2005/0148217 | A1 | 7/2005 | Takiar |

FOREIGN PATENT DOCUMENTS

| | | |
|---|---|---|
| EP | 0581284 | 2/1994 |
| EP | 0717589 | 6/1996 |
| EP | 0720123 | 7/1996 |
| EP | 0964360 | 12/1999 |
| EP | 0971312 | 1/2000 |
| EP | 01193807 | 12/2005 |
| JP | 5275838 A | 10/1993 |
| JP | D1092477 | 12/2000 |
| JP | D1111788 | 6/2001 |
| JP | 2002015296 A | 1/2002 |
| JP | D1140249 | 4/2002 |
| JP | 2003085488 A | 3/2003 |
| JP | D1210509 | 6/2004 |
| JP | D1211215 | 7/2004 |
| JP | D1211372 | 7/2004 |
| JP | D1212851 | 7/2004 |
| JP | D12311215 | 7/2004 |
| WO | 0188843 | 11/2001 |
| WO | 02059831 | 8/2002 |
| WO | 03055009 | 7/2003 |

OTHER PUBLICATIONS

Office Action dated Feb. 26, 2008, U.S. Appl. No. 10/621,882.

Chinese Office Action dated Mar. 21, 2008, Chinese Patent Application No. 200480020545.3 filed Jun. 30, 2004.

Chinese Office Action dated Mar. 21, 2008, Chinese Patent Application No. 200480020546.8, filed Jun. 30, 2004.

Notice of Allowance dated Apr. 25, 2008, U.S. Appl. No. 10/851,466, filed May 20, 2004.

"SanDisk Introduces the World's Smallest Removable Flash Card for Mobile Phones-The miniSD Card," www.sandisk.com/pressrelease/031303_minisd.htm, Nov. 18, 2004.

Photograph of MiniSD, Japanese reference, Mar. 25, 2003.

Photograph of MiniSD Card, Mar. 25, 2003.

Photograph of MultiMedia Card, May 2000.

Photograph of SmartMedia Card, May 2000.

Photograph of SD Card, May 2001.

Quick Start Guide for the Oinoco 802.11a/b ComboCard, 2002 Proxim Corporation, pp. 1-12.

Netgear 802.11a/b Dual Band Wireless PC Card, 5 GHz/2.4GHz WAB501 User's Guide, Feb. 2003 Netgear, Inc. pp. 1-29.

SD Card Specification, Simplified Version of Secure Digital Input/Output (SDIO) Card Specification, Version 1.00, Oct. 2001, SD Association, pp. 1-20, Appendix A-E.

The MultiMedia Card System Summary, Version 3.2, MMCA Technical Committee, Jan. 2002.

High Capacity and Small Size, Meeting the Storage Needs of Today's Portable Devices, 2003 SanDisk Corporation.

Office Action dated Sep. 7, 2005, U.S. Appl. No. 10/851,466, filed May 20, 2004.

Office Action dated Jun. 6, 2006, U.S. Appl. No. 10/851,466, filed May 20, 2004.

Office Action dated Oct. 18, 2006, U.S. Appl. No. 10/995,989, filed Nov. 23, 2004.

Office Action Response dated Mar. 13, 2007, U.S. Appl. No. 10/952,609.

Office Action Response dated Aug. 16, 2007, U.S. Appl. No. 10/952,591.

Office Action Response dated Jun. 11, 2007, U.S. Appl. No. 10/995,989.

Office Action Response dated May 8, 2007, U.S. Appl. No. 10/851,466.

Supplemental Notice of Allowance dated Jul. 25, 2007, U.S. Appl. No. 10/782,969, filed Feb. 2, 2004.

Office Action dated May 30, 2007, U.S. Appl. No. 10/621,882, filed Jul. 17, 2003.

Office Action dated Mar. 16, 2007, U.S. Appl. No. 10/952,591, filed Sep. 28, 2004.

Office Action dated Jan. 17, 2007, U.S. Appl. No. 10/782,969, filed Feb. 20, 2004.
Office Action dated Jan. 10, 2007, U.S. Appl. No. 10/995,989, filed Nov. 23, 2004.
Office Action dated Jan. 8, 2007, U.S. Appl. No. 10/851,466, filed May 20, 2004.
Office Action dated Dec. 14, 2006, U.S. Appl. No. 10/952,591, filed Sep. 28, 2004.
Office Action dated Nov. 17, 2006, U.S. Appl. No. 10/621,882, filed Jul. 17, 2003.
Office Action dated Sep. 19, 2006, U.S. Appl. No. 10/952,609, filed Sep. 28, 2004.
Office Action Response dated Apr. 17, 2007, U.S. Appl. No. 10/782,969.
Office Action dated May 4, 2006, U.S. Appl. No. 10/782,969, filed Feb. 20,2004.
Office Action dated Apr. 7, 2006, U.S. Appl. No. 10/952,609, filed Sep. 28, 2004.
Office Action dated Jan. 13, 2006, U.S. Appl. No. 10/621,882, filed Jul. 17, 2003.
Office Action dated Jan. 10, 2006, U.S. Appl. No. 10/782,969, filed Feb. 20, 2004.
Office Action dated Oct. 25, 2005, U.S. Appl. No. 10/621,882, filed Jul. 17, 2003.
Office Action dated Aug. 24, 2005, U.S. Appl. No. 10/952,609, filed Sep. 28, 2004.
Office Action dated Jun. 15, 2005, U.S. Appl. No. 10/952,609, filed Sep. 28, 2004.
Notice of Allowance dated Oct. 12, 2007, U.S. Appl. No. 10/782,969.
Notice of Allowance dated Sep. 27, 2007, U.S. Appl. No. 10/952,591.
Notice of Allowance dated Sep. 20, 2007, U.S. Appl. No. 10/952,609.
Notice of Allowance dated Jul. 27, 2007, U.S. Appl. No. 10/851,466.
Notice of Allowance dated Sep. 6, 2007, U.S. Appl. No. 10/995,989.
Notice of Allowance dated Jun. 25, 2007, U.S. Appl. No. 10/782,969.
Notice of Allowance dated Apr. 5, 2007, U.S. Appl. No. 10/952,609.
International Search Report dated Jul. 2, 2005 in PCT Application No. PCT/US2004/020898.
Office Action Response dated Mar. 15, 2007, U.S. Appl. No. 10/621,882.
Notice of Allowance dated Nov. 30, 2007, U.S. Appl. No. 10/621,882.
Office Action dated Mar. 9, 2010, Japanese Application No. 2006-520195.

* cited by examiner

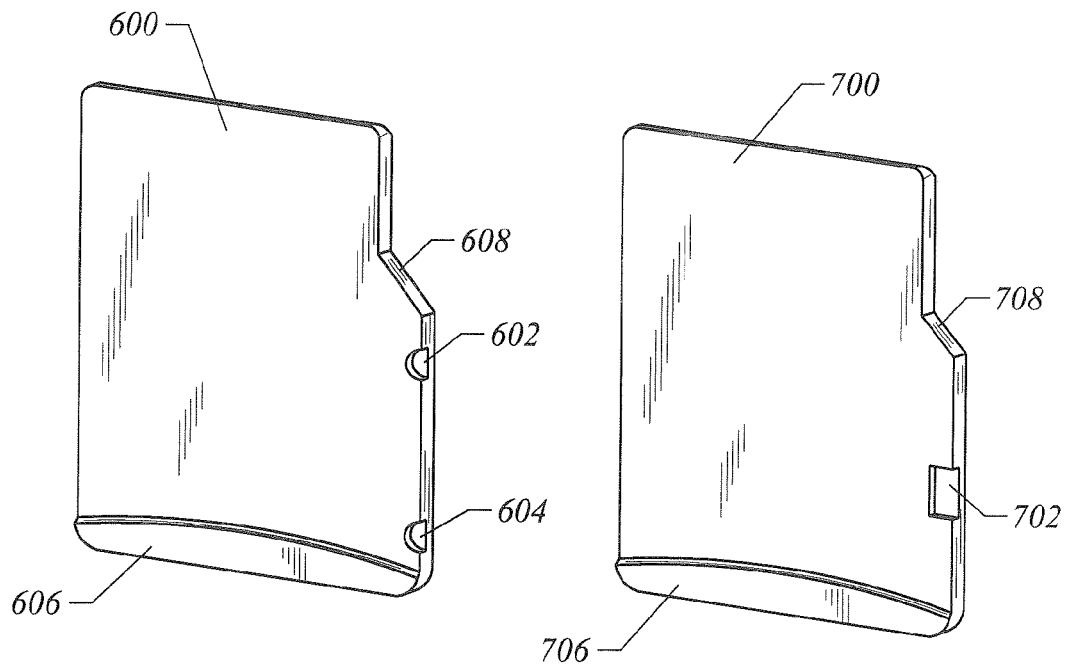
FIG. 19
FIG. 21
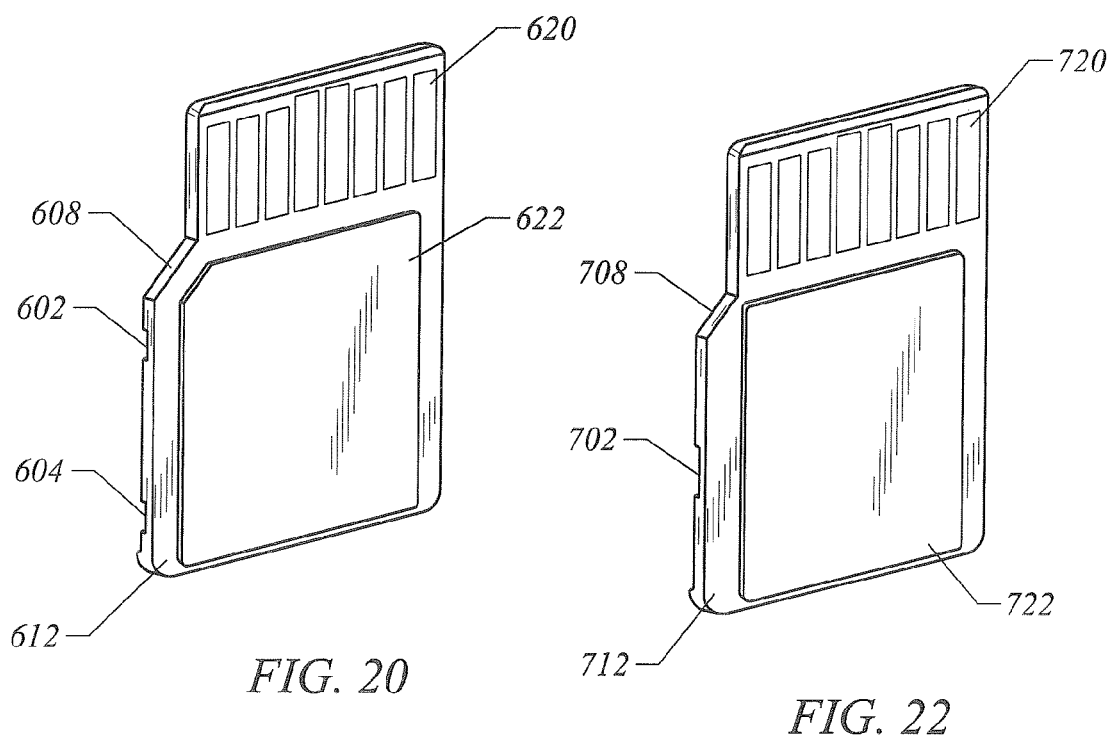
FIG. 20
FIG. 22

PERIPHERAL CARD WITH SLOPED EDGES

PRIORITY DATA

This application is a continuation of U.S. patent application Ser. No. 10/782,969, entitled "Memory Card With Raised Portion," filed Feb. 20, 2004, now pending, which is a continuation application of U.S. patent application Ser. No. 10/621,882, entitled "Peripheral Card with Hidden Test Pins," filed Jul. 17, 2003, now pending, which applications are incorporated herein by reference in their entirety.

BACKGROUND OF THE INVENTION

1. Field of the Invention

The present invention is directed to technology for peripheral cards.

2. Description of the Related Art

Memory cards are relatively small removable cards that provide data storage. In most cases, but not required in all cases, the memory card is integrated circuit based. These memory cards plug into or are received by ports or connectors on electronic devices, including computing devices, cameras, mobile telephones, PDAs and other devices. One example of a memory card uses non-volatile memory. Electrical Erasable Programmable Read Only Memory (EEPROM) and flash memory are among the most popular non-volatile semiconductor memories. Some examples of memory cards include CompactFlash™, MMC™, Smart Media, Secure Digital™, and the Memory Stick.

A flash memory card is a memory card that has one or more arrays of flash memory cells. Some flash memory cards also include bit line decoders, word line decoders, a state machine, a controller and other circuitry. In many cases the controller will be implemented in a first semiconductor die, while the array of flash memory cells, bit line decoders, word line decoders, and state machine are implemented in a second semiconductor die. Over time, flash memory arrays have increased density by shrinking the size of an individual memory cell and by implementing greater numbers of memory cells in the array.

To maintain product reliability and customer satisfaction, manufacturers of memory cards will test the memory cards during the manufacturing process in order to determine if there are any manufacturing defects. In many cases, the user I/O pins on the memory card connect to the controller. However, a test performed during manufacturing typically seeks to directly access the memory array (bypassing the controller) in order to test each cell in the memory array. Additionally, more pins will allow for more efficient and complete testing of the relevant components of the memory card. Thus, many memory cards will include test pins, in addition to the user I/O pins. To protect the memory card from electrostatic discharge relative to the test pins and to protect the data on the card from being wrongfully accessed via the test pins, the test pins should not be exposed to the user of the memory card after the manufacturing process.

One example of a memory card is described in U.S. Pat. No. 6,410,355 (the '355 Patent"), incorporated herein by reference in its entirety. In the '355 Patent, a memory card using flash memory is manufactured with a set of test pins at one edge of the memory card. After the memory card is tested, the test pins are then cut off of the memory card and the memory card is then packaged. While the device of the '355 Patent has worked well, there is a need for an improvement. First, the test pins that are cut off use real estate on the circuit board. There is a trend to increase density on circuit boards; therefore, it would be advantageous to not use a portion of the circuit board for components that will not ship to customers. Second, if the memory card fails in the field, there are no test pins to test the device in order to determine why the memory card failed. Such tests following device failure allow a manufacturer of memory cards to improve device reliability and the manufacturing process.

Another example of a memory card using flash memory is the recently released Mini-SD Card. In one commercial version of the Mini-SD Card, the memory array is mounted on the top of the circuit board and the controller is mounted on the memory array. User I/O pins and test pins are formed on the bottom of the circuit board. After the memory card is tested, the circuit board (with the controller, memory array and other components) are enclosed by attaching a top lid to a bottom lid. Both the bottom lid and the top lid are made of a hard plastic, and are manufactured from a mold prior to enclosing the circuit board. After the top and bottom lids are made, the top lid is ultra-sonically welded to the bottom lid to enclose the circuit board (with the controller, memory array and other components). The bottom lid has an opening for the user I/O pins. The bottom lid does not have an opening for the test pins; therefore, the test pins are not exposed to users. There will be a small air gap between the bottom lid and bottom of the circuit board. While this design works well, the top and bottom lids are relatively expensive to manufacture. Additionally, the lids are relatively bulky which limits how small the memory cards can be manufactured. The trend in the industry to further decrease the size of memory cards.

Thus, there is a need to provide for test pins for a memory card without the limitations described above. Similar issues exist with other types of peripheral cards, such as peripheral cards that implement wireless communication devices, GPS devices, cellular devices, network interfaces, modems, disk storage systems, and other devices.

SUMMARY OF THE INVENTION

The present invention, roughly described, pertains to technology for a peripheral card with hidden test pins. One embodiment of the present invention includes a circuit board, circuit elements on said circuit board, a set of user terminals on the circuit board that are in communication with at least a subset of the circuit elements, a set of test terminals on said circuit board that are in communication with one or more of the circuit elements, an enclosure that covers a portion of the circuit board without covering the set of user terminals and the set of test terminals, and a conformal contact coating on a first surface of the circuit board covering the test terminals and preventing access to the test terminals.

One embodiment of manufacturing such a peripheral card includes adding circuit elements to a circuit board, where the circuit board (at some point in time) includes a set of test terminals. One or more of the circuit elements are tested using the test terminals. The test terminals are subsequently covered with a conformal contact coating in order to prevent access to the test terminals. In one implementation, the test terminals are covered with a conformal contact coating by applying a liquid directly to a first surface of the circuit board. In another implementation, the test terminals are covered with a conformal contact coating by applying a film directly to a first surface of said circuit board.

Some embodiments of the present invention will include manufacturing the peripheral cards a batch at a time, followed by singulation of the batch into individualized memory cards. The present invention allows for the covering of the test pins before or after singulation. For example, one implementation includes the steps of adding circuit elements to a plurality of circuit boards of a strip (each of the plurality of circuit boards includes a set of test terminals), separating the connected circuit boards, testing the circuit elements of the circuit boards using the test terminals, and applying a conformal contact coating on a first surface of each of the circuit boards. The conformal contact coating covers the test terminals and prevents access to the test terminals such that a particular circuit board has its test terminals covered after that particular circuit board has been tested.

The present invention can be applied to the manufacture of memory cards, including flash memory cards. The technology disclosed herein can also be applied to other peripheral cards. For example, the present invention can be used with removable peripheral cards that include wireless communication devices, GPS devices, cellular devices, network interfaces, modems, disk storage systems, and other devices. The present invention is not limited to any one type of peripheral card and is meant to be used with many different types of peripheral cards.

These and other objects and advantages of the present invention will appear more clearly from the following description in which the preferred embodiment of the invention has been set forth in conjunction with the drawings.

BRIEF DESCRIPTION OF THE DRAWINGS

FIG. 19 is a perspective view of the top of the memory card according to an additional embodiment of the present invention.

FIG. 20 is a perspective view of the bottom of the memory card according to the embodiment of FIG. 19.

FIG. 21 is a perspective view of the top of the memory card according to an additional embodiment of the present invention.

FIG. 22 is a perspective view of the bottom of the memory card according to the embodiment of FIG. 21.

DETAILED DESCRIPTION

Figure 1:
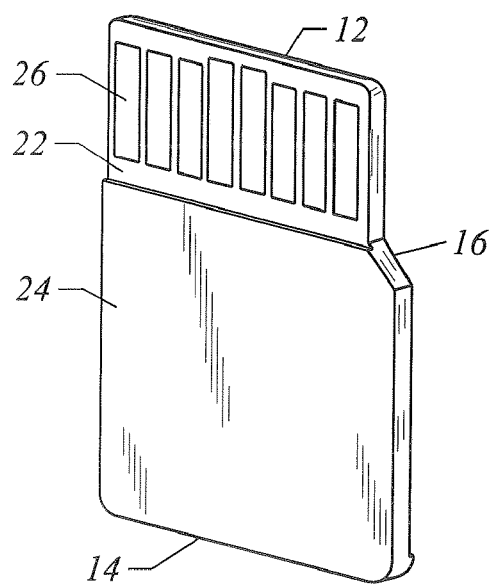
FIG. 1 is a perspective view of the bottom of a memory card according to a first embodiment of the present invention.
Figure 2:
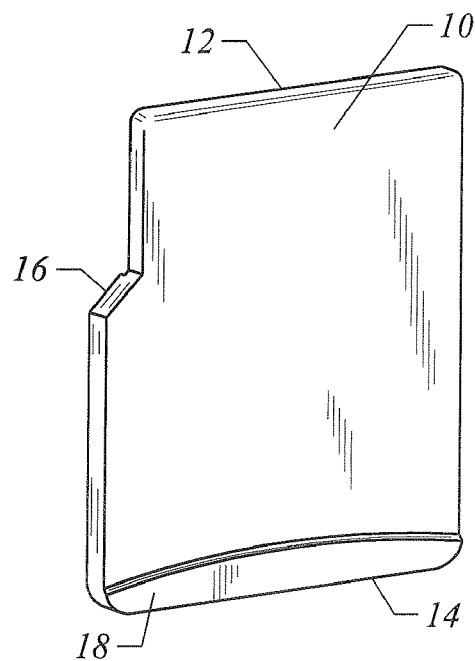
FIG. 2 is a perspective view of the top of the memory card according to the first embodiment of the present invention.
Figure 3:
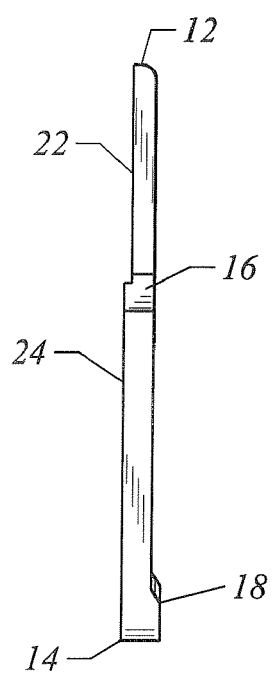
FIG. 3 is a first side view of the memory card according to the first embodiment of the present invention.

FIGS. 1-10 depict various embodiments of a memory card. For example, FIG. 1 is a perspective view of the bottom of a memory card according to a first embodiment of the present invention. FIG. 2 is a perspective view of the top of the memory card according to the first embodiment of the present invention. FIG. 3 is a side view of the memory card according to the first embodiment of the present invention. The memory card of FIGS. 1-3 includes a top surface 10, a bottom surface, a front surface 12, a back surface 14 and two side surfaces. One of the side surfaces has an angle portion 16. Top surface 10 has a raised portion 18 adjacent to back surface 14. Raised portion 18 allows the memory card to be more easily grabbed by a human hand (or mechanical device) and also provides additional room to store passive devices such as capacitors and/or resistors. Note that raised portion 18 of FIG. 1 has a curved profile. The bottom surface includes a first portion 22 and a second portion 24. Second portion 24 is raised from first portion 22. First portion 22 includes a set of user I/O pins 26 and corresponds to a bottom surface of a circuit board, as discussed below.

In one implementation, the memory card is 12 mm wide and 15 mm long. The angled portion is at a forty five degree angle. The thickness of the memory card is 0.9 mm at second portion 24, 1.0 mm at raised portion 18 and 0.8 mm at first portion 22. In another embodiment, the thickness of the memory card is 0.8 mm at second portion 24, 1.0 mm at raised portion 18 and 0.7 mm at first portion 22. In other embodiments, other dimensions can also be used.

In one embodiment, a label will be placed on the top surface. This label can be a sticker or can be ink which is pad printed.

Figure 4:
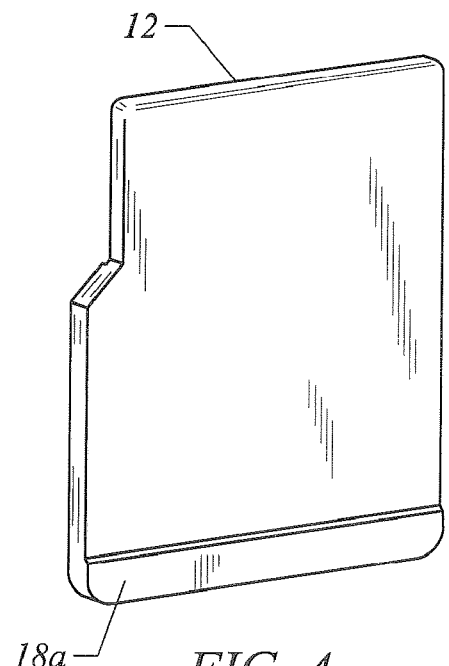
FIG. 4 is a perspective view of the top of a memory card according to a second embodiment of the present invention.
Figure 5:
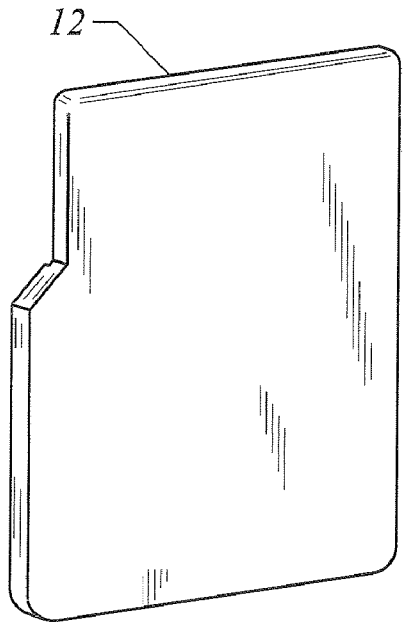
FIG. 5 is a perspective view of the top of a memory card according to a third embodiment of the present invention.

FIG. 4 is a perspective view of the top of a memory card according to a second embodiment of the present invention. The second embodiment includes a raised portion 18a that has a straight profile. FIG. 5 is a perspective view of the top of a memory card according to a third embodiment of the present invention which does not include a raised portion 18.

Figure 6:
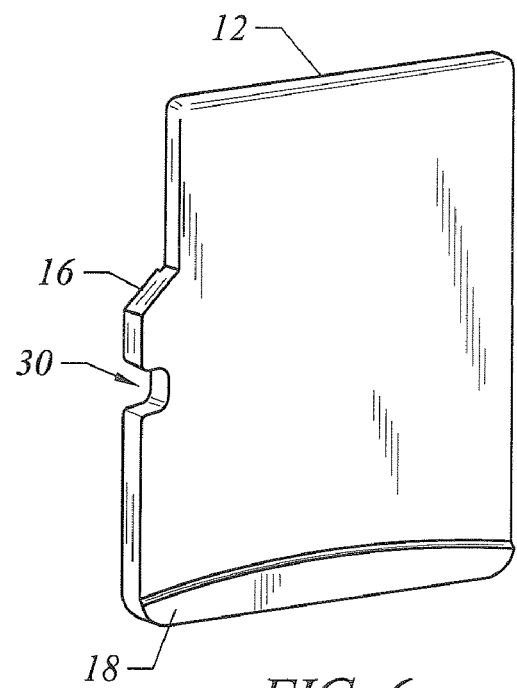
FIG. 6 is a perspective view of the top of a memory card according to a fourth embodiment of the present invention.
Figure 7:
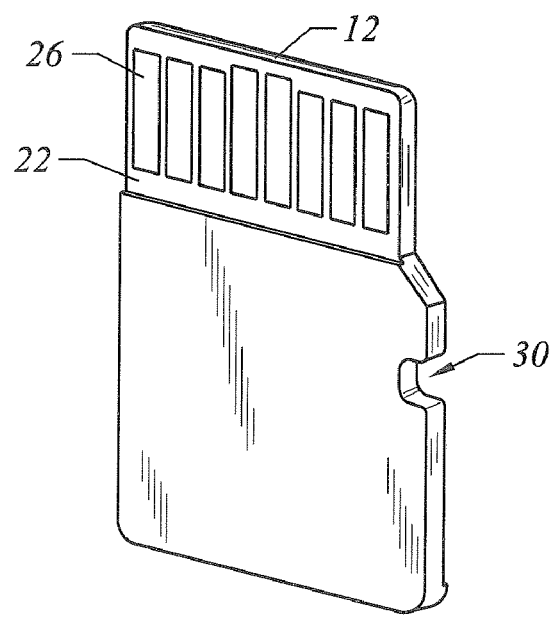
FIG. 7 is a perspective view of the bottom of the memory card according to the fourth embodiment of the present invention.

FIG. 6 is a perspective view of the top of a memory card according to a fourth embodiment of the present invention. FIG. 7 is a perspective view of the bottom of the memory card according to the fourth embodiment of the present invention. The fourth embodiment includes notch 30. The notch is used to secure the card in position when connected to a host device.

Figure 8:
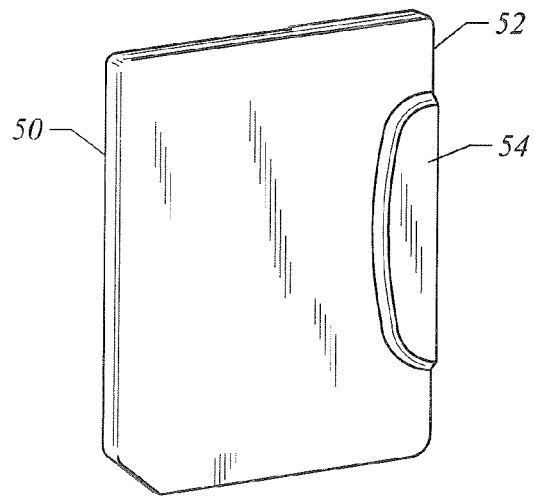
FIG. 8 is a perspective view of the top of a memory card according to a fifth embodiment of the present invention.
Figure 10:
FIG. 10 is a side view of the memory card according to the fifth embodiment of the present invention.
Figure 9:
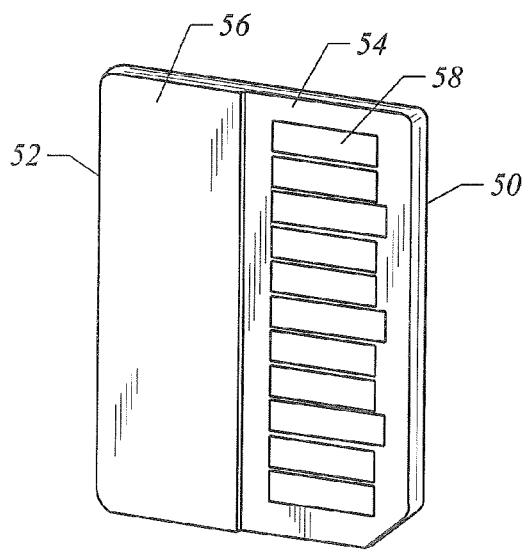
FIG. 9 is a perspective view of the bottom of the memory card according to the fifth embodiment of the present invention.

FIG. 8 is a perspective view of the top of the memory card according to a fifth embodiment of the present invention. FIG. 9 is a perspective view of the bottom of the memory card according to the fifth embodiment of the present invention. FIG. 10 is a side view of the memory card according to the fifth embodiment of the present invention. The fifth embodiment of the present invention implements a different orientation than the other embodiments described above. For example, the top surface of the memory card in the fifth embodiment includes a raised portion 54 adjacent back edge 52, which runs along the length as opposed to the width of the memory card. The memory card of the fifth embodiment includes a front surface 50 that also runs along the length of the memory card. The bottom surface of the memory card includes a first portion 54 and second portion 56. First portion 54 includes a set of user I/O pins 58 and corresponds to a bottom surface of a circuit board, as discussed below. Second portion 56 is raised from first portion 54.

Figures 11, 12:
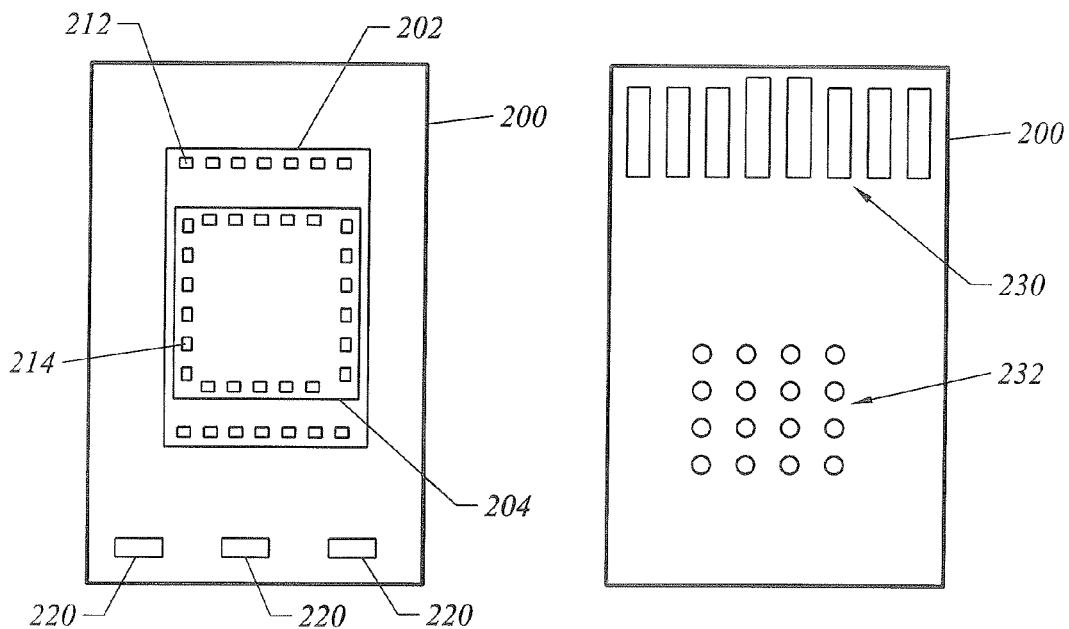
FIG. 11 is a top view of a circuit board used for various embodiments of the present invention.
FIG. 12 is a bottom view of the circuit board used for various embodiments of the present invention.

FIG. 11 provides a top view of a circuit board used for various embodiments of the present invention. FIG. 11 shows circuit board 200. Mounted on circuit board 200 are first die 202 and second die 204. In one embodiment, die 202 includes a flash memory array with associated circuitry and die 204 includes a controller. In some embodiments, the memory card may include more than one memory array. In embodiments that include a peripheral card other than a memory card, the dies can be components other than or in addition to memory arrays and controllers. Note that die 202 includes contacts 212 (e.g. die bond pads) which are used to connect die 202 to other components. Similarly, die 204 includes contacts 214 (e.g. die bond pads) to connect die 204 to other components. Circuit board 200 also includes passive components 220, which could include capacitors and/or resistors. Circuit board 200 includes a number of conductive traces (not shown) which interconnect the devices mounted on the circuit board. Connecting regions (not depicted) are provided on the circuit board so that the leads from dies can be connected to the circuit board by conventional wire bonding. In other embodiments, other means different than wire bonding can be used to connect the dies to the circuit board.

FIG. 12 shows the bottom of circuit board 200. In one embodiment, the bottom of circuit board 200 includes user I/O pins 230 and test pins 232. FIG. 12 depicts eight user I/O pins 230 and sixteen test pins 232; however, different numbers of pins can also be used. The test pins 232 can include data pins and/or power pins. The test pins are used to test one or more of the components of the memory card. For example, the test pins can be used to test each of the cells of the memory array. The user I/O pins 230 are used by a host device connected to the memory card in order to communicate with the memory card. For example, the user I/O pins 230 can be used to communicate with the controller on die 204. Note that in order to have a small package, one embodiment of the present invention includes mounting the integrated circuits on a first surface of the circuit board (e.g. the top surface) and forming the terminals (user I/O pins and test pins) on a conductive layer on another surface of the circuit board (e.g. the bottom surface).

Figure 13:
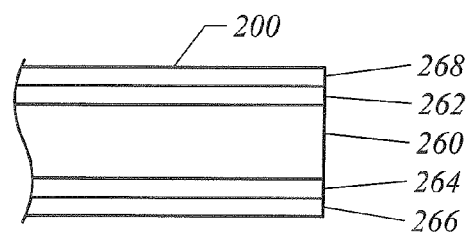
FIG. 13 is a cross section of an exemplar circuit board.

FIG. 13 shows a cross sectional view of circuit board 200. FIG. 13 shows five layers 260, 262, 264, 266, and 268. Other embodiments have less than or more than five layers. Layer 260, the middle layer, is an insulating core layer. Layers 262 and 264 are routing layers, which include conductive metal traces. Layers 266 and 268 include solder masks. Connections between layers (such as layers 262 and 264) can be made by conductive vias. In one embodiment, the circuit board is a printed circuit board. In another embodiment, the circuit board is a lead frame. Other types of circuit boards may also be used within the spirit of the present invention.

Figure 14:
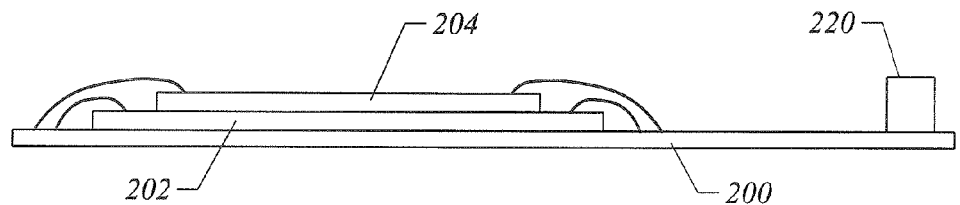
FIG. 14 is a cross sectional view of one embodiment of a circuit board and various components on the circuit board during the manufacturing process.
Figure 15:
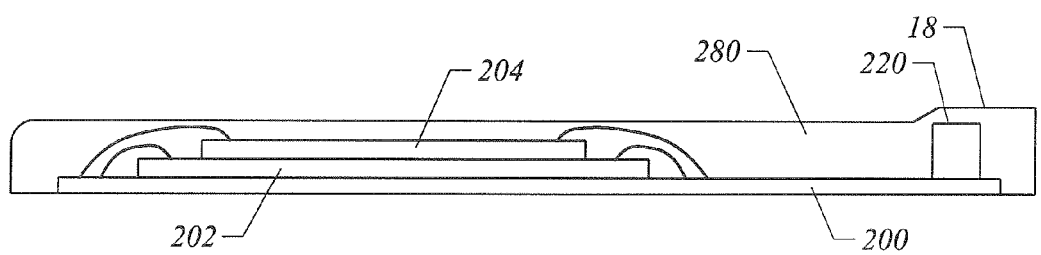
FIG. 15 is a cross sectional view of one embodiment of a circuit board and various components encapsulated on the circuit board during the manufacturing process.
Figure 16:
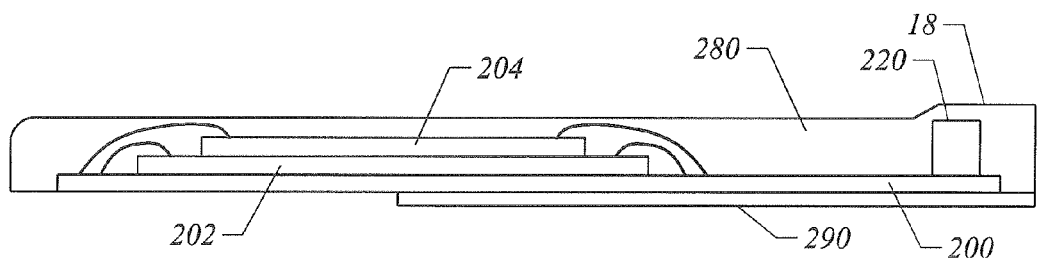
FIG. 16 is a cross sectional view of one embodiment of a circuit board and various components on the circuit board, with a conformal contact coating applied to a surface of the circuit board.

FIGS. 14-16 graphically depict the manufacturing process for creating the memory card according one embodiment of the present invention. FIG. 14 is a side view of the memory card during the manufacturing process, prior to encapsulation. FIG. 14 depicts circuit board 200. Mounted on circuit board 200 is die 202. Mounted on die 202 is die 204. FIG. 14 shows die 202 and die 204 wire bonded to circuit board 200.

FIG. 14 also shows passive devices 220, which can be capacitors and/or resistors. In one embodiment, die 202 is mounted on circuit board 200 using an adhesive material. The adhesive material may be an epoxy adhesive, soft solder or any other adhesive material for mounting a die to a substrate. Die 204 is mounted on die 202 by way of an adhesive material applied to the top surface of die 202 and the bottom surface of die 204. More information about stacking two dies on top of each other can be found in U.S. Pat. No. 5,502,289, incorporated herein by reference in its entirety. In one embodiment, the passive devices are surface mounted using solder.

FIG. 15 shows the memory card of FIG. 14 after encapsulation. That is, using an injection mold process or a transfer mold process, molding material 280 is used to encapsulate the components of the memory card. Note that the encapsulation covers the side surfaces, front surface, back surface, and top surface of circuit board 200. The encapsulation also covers all the components mounted on the top surface of circuit board 200. The bottom surface of circuit board 200, which includes user I/O pins 230 and test pins 232, is not covered by the encapsulation.

Subsequent to encapsulation, a conformal contact coating 290 is applied to a portion of the bottom surface of circuit board 200 in order to cover test pins 232. The conformal contact coating does not cover user I/O pins 230. FIG. 16 depicts the memory card after the conformal contact coating 290 has been applied. For example, the conformal contact coating 290 is applied to portion 24 (see FIG. 1) of the bottom surface of the memory card, but not to portion 22 of the memory card. The conformal contact coating protects the test pins from electrostatic discharge and protects the data in the memory from unwanted access via the test pins by blocking the test pins. The coating is a conformal contact coating because it conforms to the shape of the surface it is being applied to and it is in direct contact to that surface. Some other memory cards may use a lid to cover the bottom of the circuit board. That lid is not in contact with the bottom surface of the circuit board. Rather, an air gap will exist between the bottom lid and circuit board. Additionally, because the lid is prefabricated it will not conform to the shape of the bottom surface of the bottom of the circuit board.

In one embodiment, the application of the conformal contact coating includes applying a liquid directly to the bottom surface of the circuit board. The coating then dries to a solid. In another embodiment, the coating is applied as a film directly to the bottom surface of the circuit board. Examples of coatings include photoresist, solder mask, epoxy, thermoplastic, and polyimide. One specific example of a suitable coating is the PSR-400 Solder Mask from Taiyo America, Inc., www.taiyo-america.com. Examples of a film include mylar with an adhesive or polyimide with an adhesive. An example of a suitable polyimide is Kapton, by DuPont. One example of how to apply a liquid coating is to use a screen printing process.

Figure 17:
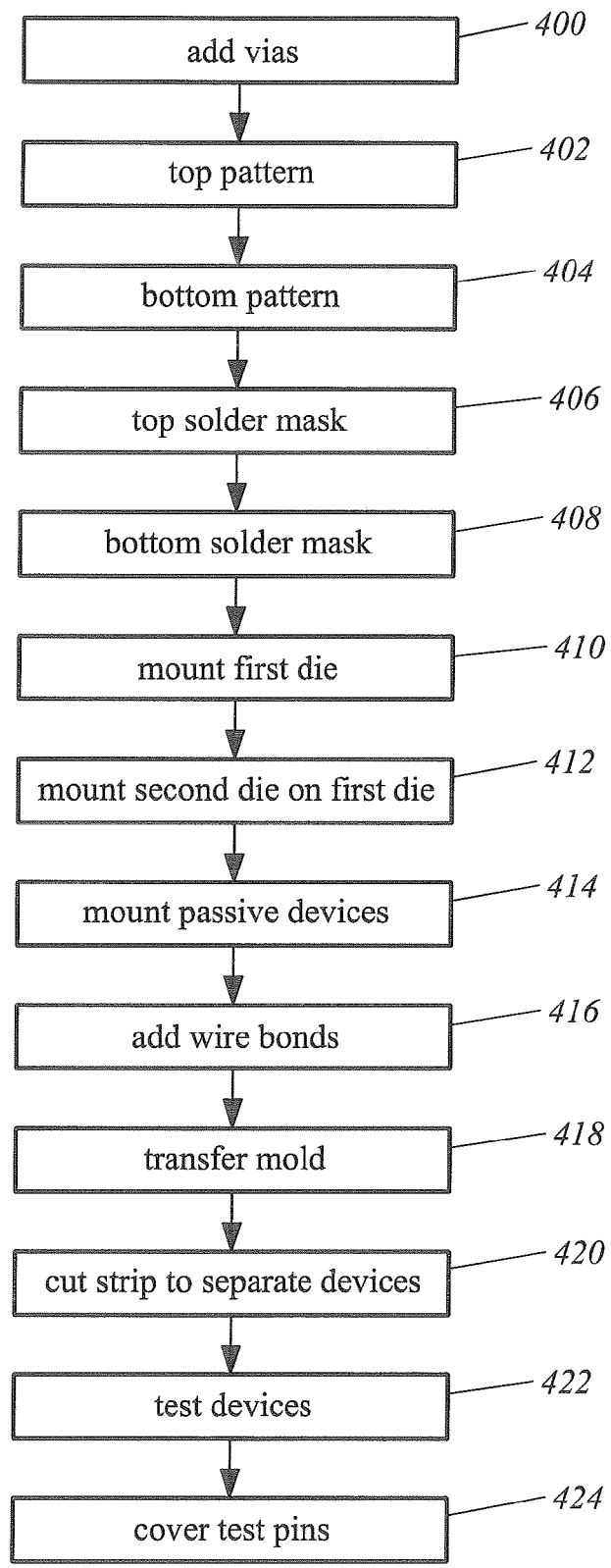
FIG. 17 is a flow chart describing one embodiment of a process for manufacturing a memory card according to the present invention.

FIG. 17 is a flowchart depicting one embodiment of a process for manufacturing a memory card according to the present invention. In step 400, vias are drilled in the circuit board. In step 402, a top pattern is applied to circuit board 200 to add the conductive traces and connection regions discussed above. In step 404, a bottom pattern is applied to the bottom surface of circuit board 200 to add the user I/O pins 230, 232 test pins and conductive traces. In step 406, solder mask is added to the top surface of circuit board 200. In step 408, the solder mask is added to the bottom surface of circuit board 200. In step 410, first die 202 is mounted to circuit board 200. In step 412, second die 204 is mounted to circuit board 200. In step 414, passive devices 220 are mounted to circuit board 200. In step 416, wire bonds are added to connect dies 202 and 204 to circuit board 200. In one embodiment, protective coatings are applied to the wire bonds and/or the dies. In step 418, circuit board 200 and the components mounted on circuit board 200 are subject to a transfer mold process so that the circuit board and its components are encapsulated, as described above. However, the encapsulation process of step 418 does not cover the bottom surface of circuit board 200.

In one embodiment, a memory card is manufactured as a unitary structure. In that case, step 420 is skipped and the process of FIG. 17 proceeds to step 422. However, in other embodiments the memory cards are produced a batch at a time. That is, a strip of memory cards are produced at one time and then a singulation process is performed to cut the strip into individualized memory cards. In the case where the memory cards are produced at a batch at a time, step 420 includes cutting the strip to separate the various memory cards. Step 420 is referred to as singulation.

In step 422, the memory cards are tested. In step 424, the test pins are covered, as described above, by applying the conformal contact coating to a portion of the bottom surface of the circuit board 200 (e.g. bottom portion 24 of FIG. 1).

Step 422 includes testing the memory cards. During the manufacturing process, the manufacturer may perform a burn-in test of the memory card to verify that each of the memory cells in the memory array are functional. The manufacturer may then program the memory card to avoid bad memory cells. For example, the memory array may include a portion of memory that stores addresses for bad memory cells and pointers to replacement memory cells. In some embodiments, the other components of the memory card may also be tested. Note that FIG. 17 shows that the devices are tested and receive the conformal contact coating after singulation. In another embodiment, step 420 is performed after to step 422; therefore, the various devices are tested and receive the conformal contact coating prior to singulation.

Figure 18:
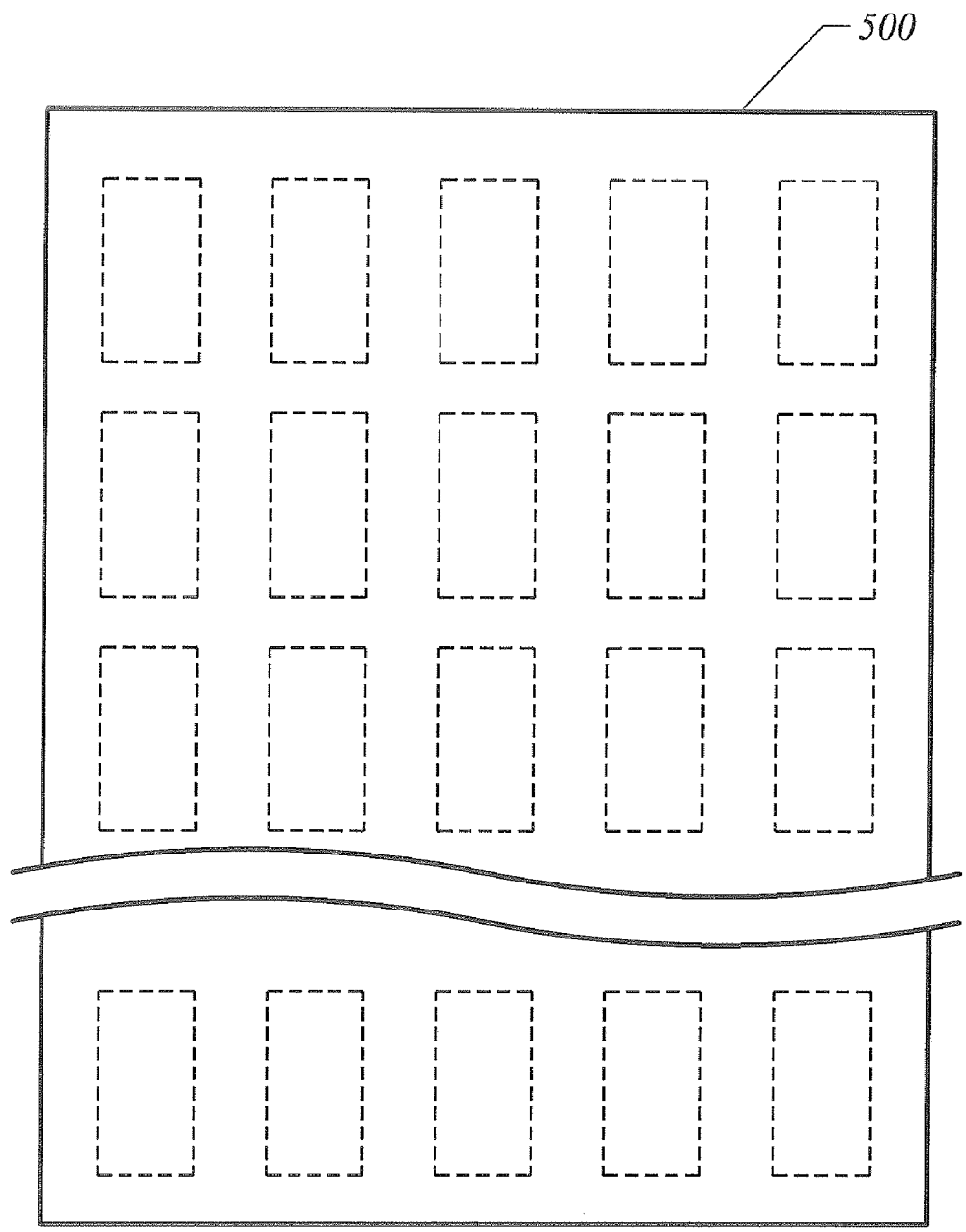
FIG. 18 is a plan view of a strip of memory cards prior to singulation.

FIG. 18 is a plan view of a strip of memory cards prior to singulation. FIG. 18 shows strip 500. On top of strip 500 are various instances of the memory cards. Each memory card is depicted in dashed lines. In one embodiment, strip 500 includes 100 memory cards (5 wide, 20 long). Note that other numbers of memory cards can also be manufactured on a strip. Strip 500 is manufactured by performing steps 400-418 simultaneously for each of the memory cards on the strip. That is, the steps are performed on the strip as a whole. Step 420 is performed by cutting the strip into separate devices. According to one aspect of the present invention, the memory cards are not fully rectangular in their shape. Therefore, the singulation of the strip into individual memory cards includes nonlinear (e.g. curvilinear) sawings. Such sawing can be performed efficiently with a very thin saw with high precision and detail, such that the sawing action is very fine. Examples of the sawing devices include, for example, a water jet cutting device, a laser cutting apparatus, a water guided laser, a dry media cutting device, and a diamond coated wire. Water jet cutting may be the preferred cutting method given its small cutting width (e.g. 50 microns), its ability to shape small features and its rapid cutting rate.

If the memory card fails after it is in use, then the failed memory card can be debugged by removing the conformal contact coating and using the test pins to test the memory card.

FIG. 19 is a perspective view of the top of the memory card according to an additional embodiment of the present invention. FIG. 20 is a perspective view of the bottom of the memory card according to the embodiment of FIG. 19. Card 600 depicted in FIGS. 19 and 20 includes rounded notches 602 and 604, raised portion 606 and angled portion 608. Bottom surface 612 includes pins 620 and portion 622. Portion 622 is raised from surface 612 and covers the test pins as described herein.

FIG. 21 is a perspective view of the top of the memory card according to an additional embodiment of the present invention. FIG. 22 is a perspective view of the bottom of the memory card according to the embodiment of FIG. 21. Card 700 depicted in FIGS. 21 and 22 includes notch 702, raised portion 706 and angled portion 708. Bottom surface 712 includes pins 720 and portion 722. Portion 722 is raised from surface 712 and covers the test pins as described herein.

The description above specifically discusses memory cards. One set of embodiments of the present invention specifically pertain to flash memory cards, which include one or more memory arrays that utilize flash memory technology. The embodiments explained above pertaining to memory cards are for example purposes and are not mean to limit the invention. The technology disclosed herein can also be applied to other peripheral cards that connect to a computing device and are controlled or operated with the computing device. One example of a removable peripheral card is a PCMCIA card. Examples of applications, in addition to memory systems, that can be implemented on peripheral cards include wireless communication devices, GPS devices, cellular devices, network interfaces, modems, disk storage systems, etc. The present invention is not limited to any one type of peripheral card and is meant to be used with many different types of peripheral cards.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A non-volatile memory card, comprising:
   a bottom surface including a first planar portion and a second planar portion residing in a different plane than the first planar portion;
   a top surface opposite the bottom surface, the top surface having a raised portion;
   a bottom edge extending between the top and bottom surfaces;
   a top edge opposite the bottom edge, the bottom surface further including a plurality of input/output (I/O) pins in the first planar portion and adjacent the top edge, a I/O pin distance being defined from one edge of the I/O pins to an opposite edge of the I/O pins in a direction parallel to the top edge;
   first and second side edges extending between the top and bottom surfaces and the top and bottom edges, the first side edge of the first and second side edges including first and second sections extending generally parallel to each other and a third section extending between the first and second sections and forming an oblique angle with each of the first and second sections, one of the first and second sections including a notch, a distance between the second side edge and the first section of the first side edge being substantially equal to the I/O pin distance, and a distance between the second side edge and the second section of the first side edge being greater than the distance between the second side edge and the first section of the first side;
a circuit board in said card; a plurality of non-volatile storage elements enclosed within said card; and
passive electrical elements enclosed within said card, said passive electrical elements are positioned in said second planar portion.

2. A non-volatile memory card according to claim 1, wherein:
said passive electrical elements are capacitors.

3. A non-volatile memory card according to claim 1, wherein the first planar portion is an area substantially occupied by the set of contacts on the bottom surface.

4. A non-volatile memory card according to claim 1, wherein:
said passive electrical elements are in electrical communication with said non-volatile storage elements.

5. A non-volatile memory system according to claim 1, wherein:
said non-volatile storage elements and said passive electrical elements are connected to said circuit board.

6. A non-volatile memory card according to claim 1, further comprising:
a controller, said controller is positioned within said card and is in communication with said non-volatile storage elements; and
the set of electrical contacts are in communication with said controller.

7. A non-volatile memory card according to claim 1, wherein:
said non-volatile storage elements are flash memory devices.

8. A non-volatile memory card according to claim 1, wherein:
said card includes molding material encapsulating said plurality of non-volatile storage elements and said passive electrical elements, said molding material defines said top surface and said bottom surface.

9. A non-volatile memory card according to claim 2, wherein the first and second planar portions are provided so that a thickness of the card at a point in the first planar portion is smaller than a thickness of the card at a point in the second planar portion.

10. A non-volatile memory card, comprising:
a bottom surface;
a top surface opposite the bottom surface, the top surface having a raised portion;
a bottom edge extending between the top and bottom surfaces;
a top edge opposite the bottom edge, the bottom surface further including a plurality of input/output (I/O) pins in the first planar portion and adjacent the top edge, a I/O pin distance being defined from one edge of the I/O pins to an opposite edge of the I/O pins in a direction parallel to the top edge;
first and second side edges extending between the top and bottom surfaces and the top and bottom edges, the first side edge of the first and second side edges including first and second sections extending generally parallel to each other and a third section extending between the first and second sections and forming an oblique angle with each of the first and second sections, one of the first and second sections including a notch, a distance between the second side edge and the first section of the first side edge being substantially equal to the I/O pin distance, and a distance between the second side edge and the second section of the first side edge being greater than the distance between the second side edge and the first section of the first side;
a circuit board in said card;
non-volatile storage elements enclosed within said peripheral card; and
a passive electrical component enclosed within said removable peripheral card, said passive electrical element is positioned in said raised portion.

11. A non-volatile memory card according to claim 10, further comprising:
molding compound encapsulating the printed circuit board and plurality of non-volatile storage elements, the molding compound generally defining the top and bottom surfaces, the top and bottom edges and the pair of side edges;
test pins, exposed through a surface of the molding compound, for testing operation of the non-volatile storage elements; and
a conformal coating removably covering the test pins.

* * * * *